United States Patent
Keefe et al.

(10) Patent No.: US 10,068,944 B2
(45) Date of Patent: Sep. 4, 2018

(54) BENDING SEMICONDUCTOR CHIP IN MOLDS HAVING RADIALLY VARYING CURVATURE

(71) Applicant: Microsoft Technology Licensing, LLC, Redmond, WA (US)

(72) Inventors: Andrew Keefe, Encino, CA (US); Geoffrey P. McKnight, Los Angeles, CA (US); Guillermo Herrera, Los Angeles, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 14/677,622

(22) Filed: Apr. 2, 2015

(65) Prior Publication Data
US 2016/0293661 A1 Oct. 6, 2016

(51) Int. Cl.
*H01L 21/00* (2006.01)
*H01L 27/148* (2006.01)
*H01L 27/146* (2006.01)

(52) U.S. Cl.
CPC .. *H01L 27/14806* (2013.01); *H01L 27/14601* (2013.01); *H01L 27/14607* (2013.01); *H01L 27/14625* (2013.01); *H01L 27/14683* (2013.01); *H01L 27/14698* (2013.01)

(58) Field of Classification Search
USPC .... 438/64, 15, 25, 26, 51, 56, 65, 106, 124, 438/126, 127
See application file for complete search history.

(56) References Cited

U.S. PATENT DOCUMENTS

| | | | |
|---|---|---|---|
| 5,349,443 A | * | 9/1994 | Guerra ........... B82Y 20/00 356/600 |
| 5,514,888 A | | 5/1996 | Sano et al. |
| 6,255,025 B1 | | 7/2001 | Akutsu et al. |
| 6,285,400 B1 | | 9/2001 | Hokari |

(Continued)

FOREIGN PATENT DOCUMENTS

| | | |
|---|---|---|
| EP | 1132967 | 9/2001 |
| EP | 2458638 A1 | 5/2012 |
| JP | 2012182194 A | 9/2012 |

OTHER PUBLICATIONS

Office action for U.S. Appl. No. 14/491,903, dated May 5, 2016, McKnight et al., Image Sensor Bending by Induced Substrate Swelling, 12 pages.

(Continued)

*Primary Examiner* — Timor Karimy
(74) *Attorney, Agent, or Firm* — Drinker Biddle & Reath LLP

(57) ABSTRACT

Techniques for fabricating a semiconductor chip having a curved surface include placing a substantially flat photonic sensor chip on a recessed surface of a mold such that an active region of the photonic sensor chip at least partially covers a concave central region of the mold and an inactive region of the photonic sensor chip at least partially covers a convex peripheral region of the mold. The mold has a radially varying curvature and the recessed surface includes the concave central region and the convex peripheral region concentrically surrounding the concave central region. Pressure may be applied on the photonic sensor chip to press and bend the photonic sensor chip into the mold.

20 Claims, 6 Drawing Sheets

(56) References Cited

U.S. PATENT DOCUMENTS

| | | | |
|---|---|---|---|
| 6,312,959 | B1 | 11/2001 | Datskos |
| 6,451,670 | B1 | 9/2002 | Takisawa et al. |
| 6,706,448 | B1 | 3/2004 | Gole et al. |
| 6,762,510 | B2 | 7/2004 | Fock et al. |
| 6,791,072 | B1 | 9/2004 | Prabhu |
| 7,190,039 | B2 | 3/2007 | Boettiger |
| 7,397,066 | B2 | 7/2008 | Oliver |
| 7,507,944 | B1 | 3/2009 | Arnzen et al. |
| 7,626,621 | B2 | 12/2009 | Ito et al. |
| 7,696,588 | B2 | 4/2010 | Boettiger et al. |
| 7,714,437 | B2 | 5/2010 | Naya |
| 7,733,397 | B2 | 6/2010 | Lu et al. |
| 7,742,090 | B2 | 6/2010 | Street et al. |
| 7,923,793 | B2 | 4/2011 | Choi et al. |
| 8,124,519 | B2 | 2/2012 | Bone |
| 8,248,499 | B2 | 8/2012 | Sutton et al. |
| 8,810,671 | B2 | 8/2014 | Winter |
| 8,836,805 | B2 | 9/2014 | Sutton et al. |
| 8,878,116 | B2 | 11/2014 | Itonaga |
| 2003/0013280 | A1 | 1/2003 | Yamanaka |
| 2004/0133275 | A1 | 7/2004 | Mansmann |
| 2004/0229071 | A1 | 11/2004 | Jankosky et al. |
| 2005/0030408 | A1 | 2/2005 | Ito et al. |
| 2005/0035514 | A1 | 2/2005 | Hillman et al. |
| 2006/0186492 | A1 | 8/2006 | Boettiger et al. |
| 2006/0275941 | A1 | 12/2006 | Oliver et al. |
| 2007/0096235 | A1 | 5/2007 | Boettiger et al. |
| 2007/0222013 | A1 | 9/2007 | Lincoln et al. |
| 2008/0237443 | A1 | 10/2008 | Oliver et al. |
| 2009/0045510 | A1 | 2/2009 | Naya |
| 2009/0115875 | A1 | 5/2009 | Choi et al. |
| 2009/0184954 | A1 | 7/2009 | Street |
| 2010/0025789 | A1 | 2/2010 | Imai et al. |
| 2010/0178722 | A1 | 7/2010 | de Graff et al. |
| 2011/0057284 | A1 | 3/2011 | Brodie |
| 2011/0163466 | A1 | 7/2011 | Taguchi et al. |
| 2011/0200883 | A1 | 8/2011 | Cui et al. |
| 2012/0002087 | A1 | 1/2012 | Kim |
| 2012/0147207 | A1 | 6/2012 | Itonaga |
| 2012/0159996 | A1 | 6/2012 | Sutton |
| 2012/0217606 | A1* | 8/2012 | Itonaga ............... H01L 31/0203 257/443 |
| 2012/0261551 | A1 | 10/2012 | Rogers |
| 2012/0299140 | A1 | 11/2012 | Sekine |
| 2013/0268490 | A1 | 10/2013 | Keebler et al. |
| 2013/0270662 | A1 | 10/2013 | Roy et al. |
| 2013/0312541 | A1 | 11/2013 | Majidi et al. |
| 2014/0004644 | A1 | 1/2014 | Roy et al. |
| 2014/0049683 | A1 | 2/2014 | Guenter et al. |
| 2014/0160327 | A1 | 6/2014 | Enoki et al. |
| 2015/0194585 | A1 | 7/2015 | Kim et al. |
| 2015/0334300 | A1 | 11/2015 | Gabriel et al. |
| 2016/0086987 | A1 | 3/2016 | McKnight et al. |
| 2016/0086994 | A1 | 3/2016 | Guenter |
| 2016/0240582 | A1* | 8/2016 | Yamamoto ........ H01L 27/14627 |
| 2016/0268327 | A1 | 9/2016 | Lin et al. |
| 2016/0286102 | A1* | 9/2016 | Sulfridge ............... H01L 21/00 |
| 2017/0117311 | A1 | 4/2017 | McKnight et al. |

OTHER PUBLICATIONS

Cherng et al., "Fabrication of polydimethylsiloxane microlens array on spherical surface using multi-replication process", in the Journal of Micromechanics and Microengineering, vol. 24, No. 1, 2014, 10 pages.

Clarke, Peter "Sony Curves Images Sensors & TSMC Stacks Them", retrieved on Jul. 30, 2014, available at °°http://www.eetimes.com/document.asp?doc_id=1321841<<, EE Times, Apr. 9, 2014, 2 pages.

Guvendiren et al., "Swelling-Induced Surface Patterns in Hydrogels with Gradient Crosslinking Density", in the Journal of Advanced Functional Materials, vol. 19, Iss. 19, Oct. 9, 2009, 9 pages.

Itonaga, "A Novel Curved CMOS Image Sensor Integrated with Imaging System", in the Proceedings of the Symposium on VLSI Technology (VLSI-Technology): Digest of Technical Papers, Jun. 19, 2014, 2 pages.

Iwert et al., "First results from a novel curving process for large area scientific imagers", in the Journal of International Society of Optics and Photonics, SPIE Astronomical Telescopes+, 2012, 14 pages.

Mokwa et al., "CMOS Transistors under Uniaxial Stress on Ultra-Thin Chips for Applications in Bendable Image Sensors", in the Proceedings of the 2012 8th Conference on Ph.D. Research in Microelectronics and Electronics (PRIME), Jun. 12, 2012, 4 pages.

Shao et al., "Synthesis Surface Effects on the Stress and Deformation of Film/Substrate System", in the Journal of Applied Surface Science, vol. 257, Iss. 23, Sep. 15, 2011, 6 pages.

"Sony Unveils Curved Sensor-Technology" retrieved on Jan. 23, 2015 at °°http://petapixel.com/2014/04/02/sony-unveils-curved-senor-technology/<<, 8 pages.

Tekaya et al, "Mechanical Behavior of Flexible Silicon Devices Curved in Spherical Configurations", in the Proceedings of the 14th International Conference on Thermal, Mechanical and Multi-Physics Simulation and Experiments in Microelectronics and Microsystems, Apr. 14, 2013, 7 pages.

PCT Search Report & Written Opinion for Application No. PCT/US2015/049276, dated Dec. 10, 2015, 13 pages.

Office action for U.S. Appl. No. 14/491,903, dated Feb. 17, 2016, McKnight et al., "Image Sensor Bending By Induced Substrate Swelling", 10 pages.

International Search Report & Written Opinion Received for PCT Application No. PCT/US2015/049277, dated Nov. 26, 2015, 10 pages.

Office Action for U.S. Appl. No. 14/677,697, dated Jun. 30, 2016, Keefe et al., "Free-Edge Semiconductor Chip Bending", 9 pages.

PCT Search Report and Written Opinion dated Jul. 1, 2016 for PCT Application No. PCT/US16/025453, 10 Pages.

The PCT Search Report and Written Opinion dated Jul. 4, 2016 for PCT applicatoin No. PCT/US2016/025454, 11 pages.

The PCT Written Opinion of the International Preliminary Examining Authority dated Aug. 4, 2016 for PCT application No. PCT/US2015/049276, 7 pages.

Office Action for U.S. Appl. No. 14/677,697, dated Dec. 28, 2016, Keefe et al., "Free-Edge Semiconductor Chip Bending", 11 pages.

Rehm, "Apple patent describes use of curved image sensor to design small camera module", available at: °°https://www.dpreview.com/articles/8027168176/apple-patent-describes-use-of-curved-image-sensor-to-design-small-camera-module<<, Jan. 28, 2016, 7 pages.

Sanyal, "Sony's curved sensors may allow for simpler lenses and better images", available at: °°https://www.dpreview.com/articles/2279255612/sony-s-curved-sensors-may-allow-for-simpler-lenses-and-better-images<<, Jun. 18, 2014, 20 pages.

Office Action for U.S. Appl. No. 14/491,928, dated Apr. 20, 2017, Guenter, "Image Sensor Bending Using Tension", 16 pages.

The International Preliminary Report on Patentability dated Mar. 20, 2017 for PCT application No. PCT/US2016/025454, 12 pages.

The Colombian Office Action dated Apr. 6, 2017 for Colombian patent application No. NC2017/0002554, a counterpart foreign application of U.S. Pat. No. 9,570,488, 3 pages.

"Notice of Allowance Issued in U.S. Appl. No. 14/491,903", dated Sep. 28, 2016, 8 Pages.

"Non Final Office Action Issued in U.S. Appl. No. 14/491,928", dated Oct. 5, 2016, 14 Pages.

"Non Final Office Action Issued in U.S. Appl. No. 15/398,266", dated Jun. 12, 2017, 16 Pages.

"International Preliminary Report on Patentability Issued in PCT Application No. PCT/US2015/049276", dated Nov. 22, 2016, 9 Pages.

"Notice of Allowance Issued in U.S. Appl. No. 14/677,697", dated Jun. 7, 2017, 7 Pages.

* cited by examiner

BENDING SEMICONDUCTOR CHIP IN MOLDS HAVING RADIALLY VARYING CURVATURE

BACKGROUND

Optical systems are commonly used in many devices, such as cameras, telescopes, binoculars, office equipment, and scientific instruments, just to name a few examples. Performance of optical systems hinges, in part, on the design of each of the elements of the system as well as the overall design of the system, which sets forth the optical interaction among the elements.

SUMMARY

This disclosure describes techniques and architectures for bending and shaping semiconductor chips, such as photonic sensor chips. In particular, a photonic sensor chip fabricated from a flat, relatively brittle material, such as silicon or gallium nitride, for example, may be shaped after the photonic sensor chip is fabricated, so that the light-sensitive surface of the photonic sensor chip is curved to have a spherical, aspheric, or other shape.

To form a curved photonic sensor chip, the photonic sensor chip may be placed in a mold having a radially varying curvature. A force may be applied to the photonic sensor chip to bend the photonic sensor chip into the shape of the mold. Using a mold having a radially varying curvature may reduce stress during bending at the outermost (non-photoactive) regions of the photonic sensor chip. Such reduction in stress may allow for the sharpest bending (highest degree of curvature) to be concentrated at the active sensor region, of which there may be more than one, of the photonic sensor chip to match a desired optical design. Beyond the active sensor region, the degree of curvature of the mold maybe relatively small to reduce bending stresses of the photonic sensor chip.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. The term "techniques," for instance, may refer to fabricating equipment, control system(s), method(s), computer-readable instructions, module(s), algorithms, or hardware logic (e.g., Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs)), which may be used to perform the technique(s) as permitted by the context above and throughout the document.

BRIEF DESCRIPTION OF THE DRAWINGS

The detailed description is set forth with reference to the accompanying figures. In the figures, the left-most digit of a reference number identifies the figure in which the reference number first appears. The use of the same reference numbers in different figures indicates similar or identical items or features.

DETAILED DESCRIPTION

Overview

Figure 1:
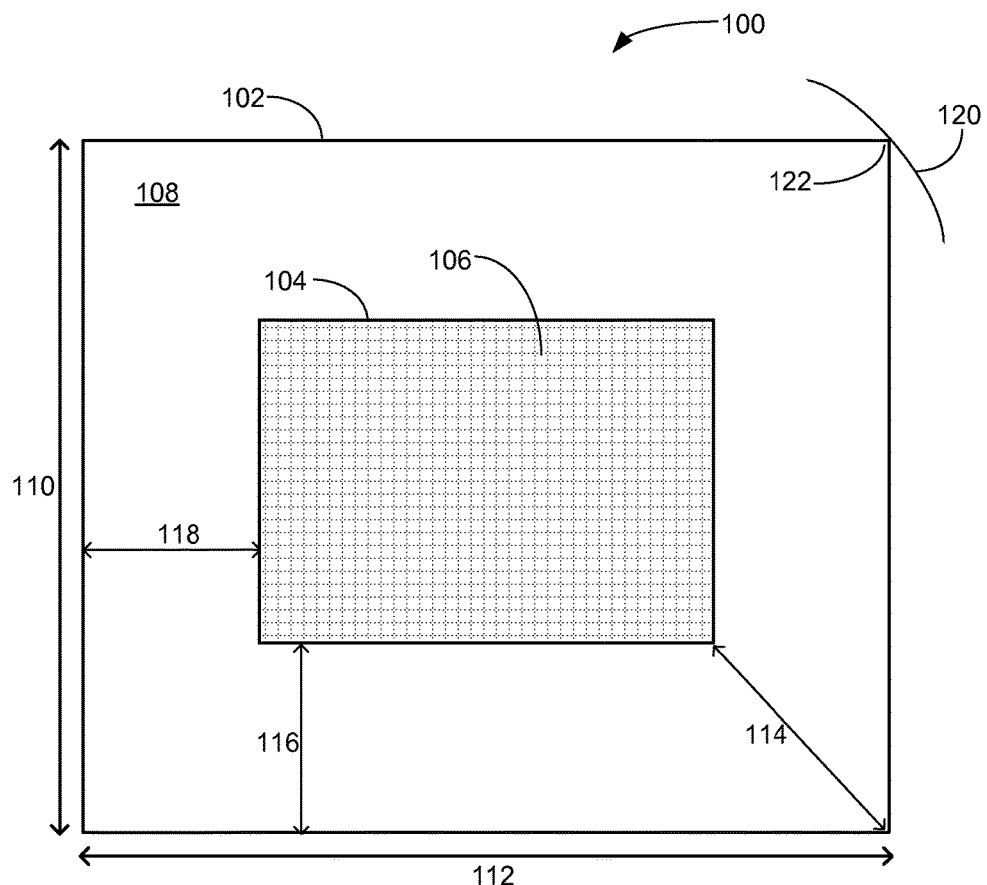
FIG. 1 is a top view of an example photonic sensor chip.

Generally, optical systems may comprise lenses, mirrors, and/or one or more light sensing devices, such as charge-coupled device (CCDs) or other devices that can convert light energy into electrical signals. A plurality of CCDs may be configured in an array (e.g. a pixelated array) fabricated on a substrate, which may be silicon, germanium, or other semiconductor material, for example. A light-sensitive device, such as a CCD, an array of CCDs, or one or more other light sensing entities, fabricated on a substrate is herein called a "photonic sensor chip". This name may refer to a light sensor that need not be configured to sense an image, but rather any electromagnetic signal (visible or not).

A photonic sensor chip may be bent so that the light-sensitive surface (active region) of the photonic sensor chip has a curved shape, which may provide a number of advantages to the design of an optical system, as compared to a flat-surface photonic sensor chip. In particular, optical systems comprising lenses, mirrors, and/or other optical components (e.g., wafer-level optics) have fewer design constraints when the optical systems include a curved photonic sensor chip, as compared to a flat-surface photonic sensor chip. For example, some design constraints may include number of lenses, acceptable tolerances for chromatic and/or spatial aberrations, and so on. A photonic sensor chip having a spherical, aspheric, or other surface may lead to a high performance optical system that produces a relatively uniform light intensity and spatial frequency response across the surface of the photonic sensor chip.

A photonic sensor chip may comprise any of a number of semiconductor materials, such as indium gallium arsenide, germanium, silicon, lead sulfide, indium arsenide, mercury cadmium telluride, and platinum silicide, just to name a few examples. In some implementations, a process for bending a flat photonic sensor chip (e.g., die) includes applying a force to the photonic sensor chip to bend the photonic sensor chip into a curved (e.g., spherical) mold having a radially varying degree of curvature. For example, an active region of the photonic sensor chip may be shaped to a particular degree (or range) of curvature of the mold while an inactive region may be shaped to another particular degree (or range) of curvature of the mold. Such a mold may be void of steps of slope discontinuities, which may exacerbate stresses during bending of the photonic sensor chip. This is in contrast, for example, to a mold having a surface that includes slope discontinuities, steps, or a single degree of curvature that is imparted to all portions of the bent photonic sensor chip. By using a mold having a greater degree of curvature for the active region and a relatively lower degree of curvature for the inactive region of the photonic sensor chip, bending-generated stresses in the photonic sensor chip may be reduced, which allows for greater deflections (e.g., sharper bending) of the active region as compared to the case where the entire photonic sensor chip is shaped to a mold having a single degree of curvature. For example, a 25 micron thick photonic sensor chip may become difficult to deform (without breaking) beyond about 50-75 microns while shaping to a mold having a single degree of curvature. In contrast, using a mold having a relatively lower degree of curvature for the inactive regions of the photonic sensor chip than for the active region can lead to more than about 150 microns of center deflection in the active region. Deflection may be measured, for example, as the distance from the un-deflected photonic sensor chip to the maximum point on the photonic sensor chip.

In various examples, the combination of a curved photonic sensor chip bonded to a mold or substrate may comprise a stand-alone optical device that may be subsequently incorporated into optical systems. For example, a manufacturer may fabricate an optical device comprising the combination of a curved photonic sensor chip bonded to the mold that was used for shaping the photonic sensor chip. The manufacturer may supply such an optical device to another manufacturer that produces optical systems. The optical device may be incorporated into such optical systems.

Various examples are described further with reference to FIGS. 1-12.

Example Environment

FIG. 1 is a top view of an example photonic sensor chip 100. Examples of techniques and apparatuses described herein may be applied to semiconductor chips and are not limited to bending photonic sensor chips. For illustrative purposes, however, examples and implementations described below involve photonic sensor chips. It should be noted that any of a number of other types of semiconductor chips may be shaped or bent using the example techniques and implementations.

Photonic sensor chip 100 includes a semiconductor substrate 102 upon which a light-sensitive portion 104 is built. Light-sensitive portion 104, which may be a CCD array, for example, includes one or more light-sensitive elements 106. Each such light-sensitive element 106, for example, may correspond to a pixel of an image produced, in part, by light-sensitive portion 104. Light-sensitive portion 104 may be referred to as an "active region," which is capable of converting light energy to electrical energy or electrical signals. Unless otherwise noted, the term "light" refers to electromagnetic energy in any portion of the spectrum. Thus, for example, light or light energy encompasses visible, infrared (IR), near-infrared (NIR), and ultraviolet (UV) portions of the electromagnetic spectrum. Although one active region is illustrated, more than one light-sensitive portion 104 may be included in photonic sensor chip 100.

An inactive region 108 may at least partially surround light-sensitive portion 104. Inactive region 108, which may be void (or substantially void) of light-sensitive elements, may include various circuit elements, conductive traces, and so on for operating light-sensitive portion 104. For example, if light-sensitive portion 104 is a CCD array, inactive region 108 may include circuitry for controlling rows and columns of the CCD elements. Each of light-sensitive portion 104 and inactive region 108 may occupy any portion of the area of photonic sensor chip 100. Light-sensitive portion 104 may, for example, be square or rectangular (or other shape) having any aspect ratio (e.g., width-to-height). Width 110 or length 112 of photonic sensor chip 100 may be in a range from about 5 millimeters up to about 25 millimeters, though claimed subject matter is not limited in this respect. In a particular example implementation, distances 114-118 from edges of light-sensitive portion 104 to edges of corners of semiconductor substrate 102 may be in a range from about 1% up to about 50% of width 110 or length 112. Such values are merely examples, and claimed subject matter is not so limited. A portion of a mold surface 120 is illustrated to indicate that a corner 122 of flat photonic sensor chip 100 may be placed on the mold surface, while other portions of the photonic sensor chip are not in contact with the mold surface, as described below.

Semiconductor substrate 102 may comprise any number of elements, including combinations of such elements, any of which may include added impurities (e.g., dopants). For example, semiconductor substrate 102 may be silicon or germanium. In some examples, thickness of photonic sensor chip 100 may range from about 5 to 10 microns up to about 50 microns. In other examples, thickness of photonic sensor chip 100 may exceed 50 microns.

Photonic sensor chip 100, which may be flat or curved, may be incorporated into an optical system that provides light in a particular fashion to photonic sensor chip 100. For example, in some implementations, a lens system may be configured to have a focal plane that coincides with the location of photonic sensor chip 100. In a particular implementation, a lens system may be configured to have a focal surface that coincides with the curved surface of a curved version of photonic sensor chip 100. In other implementations, a lens system may be configured to have a focal length that coincides with the focal length of photonic sensor chip 100. Optical elements (e.g., lenses and/or mirrors) of the optical system may at least partially determine the location of a focal plane and a focal length. In particular, a portion of an optical system that provides light to light-sensitive portion 104 may be designed based, at least in part, on particular details of light-sensitive portion 104, such as the size of light-sensitive portion 104, the resolution of light-sensitive portion 104, and the positioning of light-sensitive portion 104 with respect to the remainder of the optical system. Performance of optical systems depends, at least in part, on the design of each of the optical elements of the optical system as well as the overall design of the optical system, which sets forth the optical interaction among the optical elements. For example, light output of one lens may be the light input of a subsequent lens. Generally, quality of the optical elements and their arrangement with respect to one another increases as resolution (e.g., density of light-sensitive elements 106, such as CCD elements that correspond to pixels) increases. For example, such quality may be based, at least in part, on parameters of the individual optical elements, including, but not limited to, structural and optical aberrations, optical transmission or reflection, light uniformity, positioning, and so on.

Figure 2:
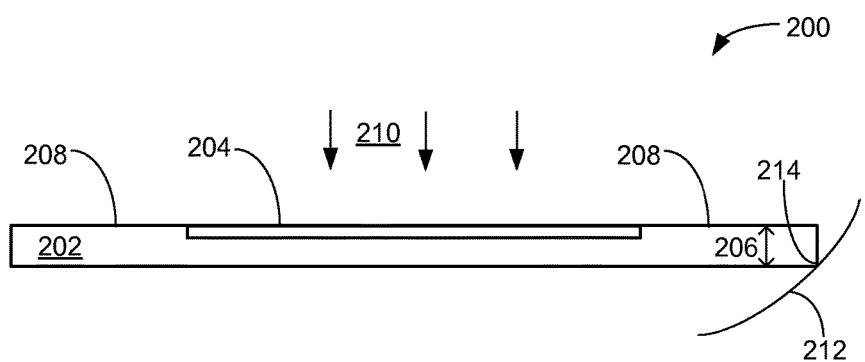
FIG. 2 is a cross-section view of an example photonic sensor chip.

FIG. 2 is a cross section view of a photonic sensor chip 200, according to various examples. Photonic sensor chip 200 may be the same as or similar to photonic sensor chip 100, illustrated in FIG. 1. Photonic sensor chip 200 includes a semiconductor substrate 202 upon which a light-sensitive active region 204 is fabricated. Although one active region is illustrated, more than one light-sensitive active region 204 may be included in photonic sensor chip 200. In some example implementations, substrate 202 may have a thickness 206 ranging from about 5 to 10 microns up to about 50 microns, though claimed subject matter is not so limited.

Active region 204 includes one or more light-sensitive elements, such as 106 illustrated in FIG. 1. An inactive region 208 may at least partially surround active region 204. Inactive region 208, which may be void of light-sensitive elements, may include various circuit elements, conductive traces, and so on for operating active region 204. Each of active region 204 and inactive region 208 may occupy any portion of the area of photonic sensor chip 200. Photonic sensor chip 200 may be positioned or arranged to receive light 210 on at least a portion of active region 204. A portion of a mold surface 212 is illustrated to indicate that a corner 214 of flat photonic sensor chip 200 may be placed on the mold surface, while other portions of the photonic sensor chip are not in contact with the mold surface, as described below.

Figure 3:
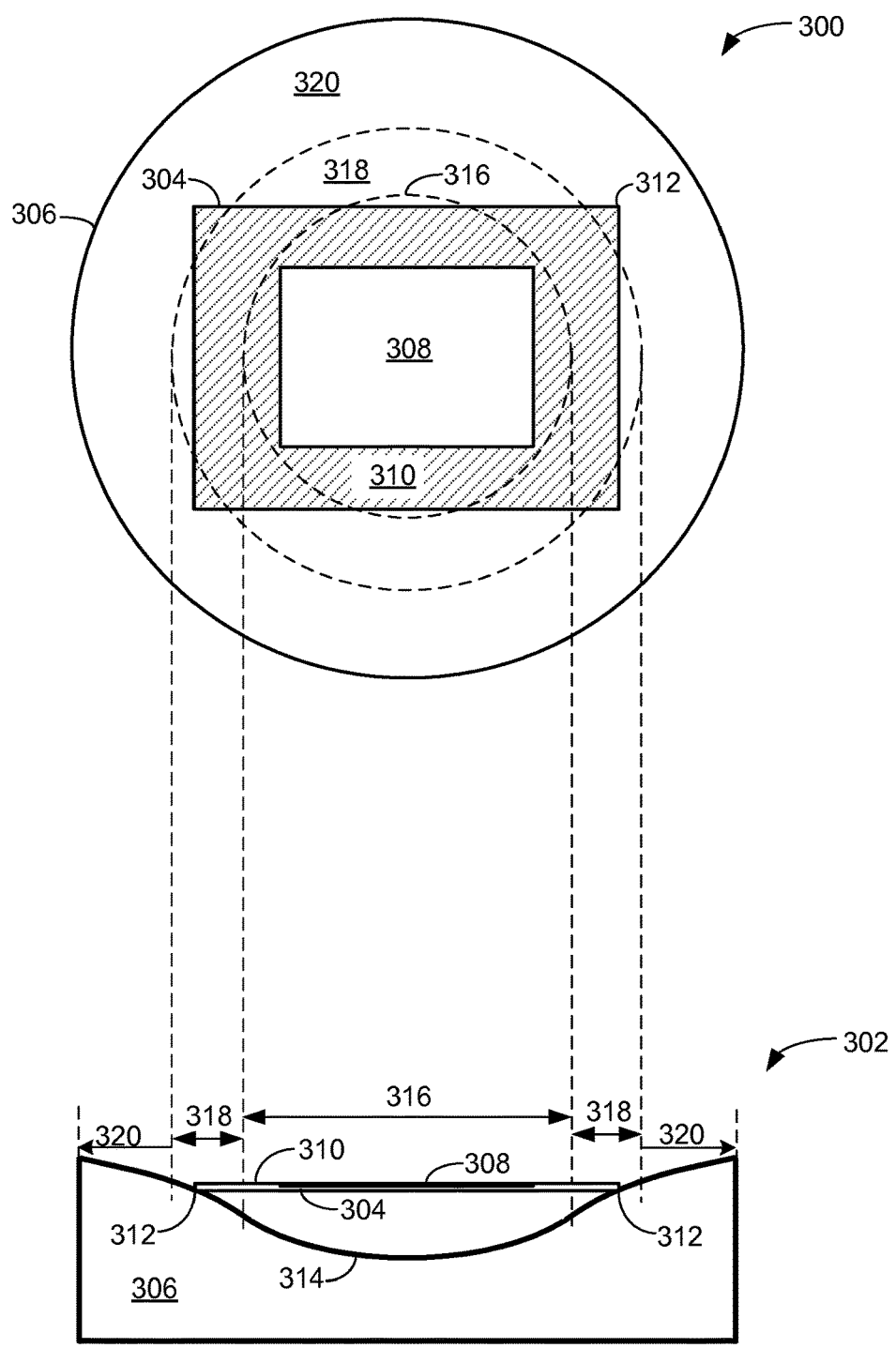
FIG. 3 includes a top view and a cross-section view of an example rectangular photonic sensor chip in a mold.

FIG. 3 includes a top view 300 and a cross section view 302 of a rectangular photonic sensor chip 304 in a mold 306, according to various examples. For example, photonic sensor chip 304, which may be the same as or similar to photonic sensor chip 202 illustrated in FIG. 2, may include an active region 308 and an inactive region 310 that surrounds active region 308. In a bending process, photonic sensor chip 304 may be placed in mold 306 so that corners 312 of photonic sensor chip 304 are in contact with a surface 314 of mold 306. Accordingly, the remainder of photonic sensor chip 304 is suspended above surface 314, as illustrated in cross section view 302.

Examples described herein involve molds having shapes that may be spherical, parabolic, aspheric, or a compound shape having one or more inflection points, just to name a few examples. In particular implementations, mold 306 has a radially varying curvature such that surface 314 of mold 306 includes a concave central region 316, a convex transition region 318, and an outer peripheral region 320. Convex transition region 318 peripherally surrounds concave central region 316. Outer peripheral region 320 peripherally surrounds both concave central region 316 and convex transition region 318. Concave central region 316 includes the apex or bottom-most portion of surface 314. Concave central region 316 may have a relatively high degree of curvature. In contrast, outer peripheral region 320 may have a relatively small degree of curvature or may be linear (zero degree curvature). Convex transition region 318 includes an inflection point where the curvature changes from concave to convex, and which is convex relative to concave central region 316. Convex transition region 318 may have a degree of curvature between that of concave central region 316 and outer peripheral region 320. Convex transition region 318 acts as a smooth and continuous transition between concave central region 316 and outer peripheral region 320 so that surface 314 has a continuous and smooth slope between the regions. Generally, a concave region of a surface having a relatively large degree of curvature may geometrically include a convex region that smoothly transitions to a surface having a relatively small degree of curvature.

In some examples, each of concave central region 316, convex transition region 318, and outer peripheral region 320 may comprise materials that are different from one another. In particular, concave central region 316 may comprise a material that is different from both convex transition region 318 and outer peripheral region 320. For example, concave central region 316 may comprise a material that may be machined or formed to a relatively high precision. In contrast, materials for convex transition region 318 and/or outer peripheral region 320 may be relatively inexpensive (e.g., material-wise and/or fabrication-wise) because, being optically insensitive, the convex transition region and the outer peripheral region need not be formed to as high a precision as that of the concave central region.

In some examples, active region 308 is over and substantially covers concave central region 316 while inactive region 310 is at least partially over convex transition region 318 and/or outer peripheral region 320. Accordingly, if a force is applied to photonic sensor chip 304 to push and bend the photonic sensor chip into surface 314 of mold 306, active region 308 will be shaped by concave central region 316, which is the portion of surface 314 having the highest degree of curvature. Such curvature may correspond to a desired optical prescription for the shape of active region 308 of photonic sensor chip 304. The shape of inactive region 310 need not be optically important because the inactive region is not used optically. Thus, inactive region 310 need not be bent to a shape having as high a degree of curvature as active region 308. A relatively small degree of curvature of portions (e.g., outer portions) of photonic sensor chip 304 other than the active region may lead to reduced bending stresses experienced by photonic sensor chip 304, as compared to the case where the entire photonic sensor chip is bent to the same relatively high degree of curvature (for a desired optical prescription). Generally, in some cases, reducing stress at corners and/or edges of a photonic sensor chip may be beneficial because edges and corners tend to be more susceptible to cracking or breaking as compared to central regions of a photonic sensor chip.

Figure 4:
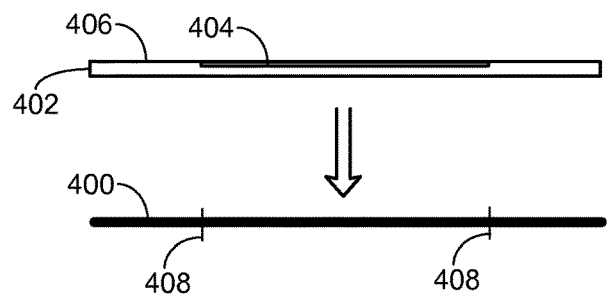
FIG. 4 illustrates a schematic representation of an example photonic sensor chip.

FIG. 4 illustrates a schematic representation 400 of a photonic sensor chip 402 illustrated in a cross section view, according to various examples. For sake of clarity, some of the figures herein illustrate a photonic sensor chip, such as 402, by schematic representation 400. In other words, photonic sensor chip 402, which may include an active region 404 and an inactive region 406, is illustrated in some of the figures as a thick line or curve. Schematic representation 400 may represent any of a number of types of semiconductor chips, and is not limited to representing a photonic sensor chip. Tick marks 408 indicate boundaries between active region 404 and inactive region 406. In particular, the active region is between the tick marks. The boundaries may or may not correspond to physical changes/variations in structure of the photonic sensor chip.

Figure 5:
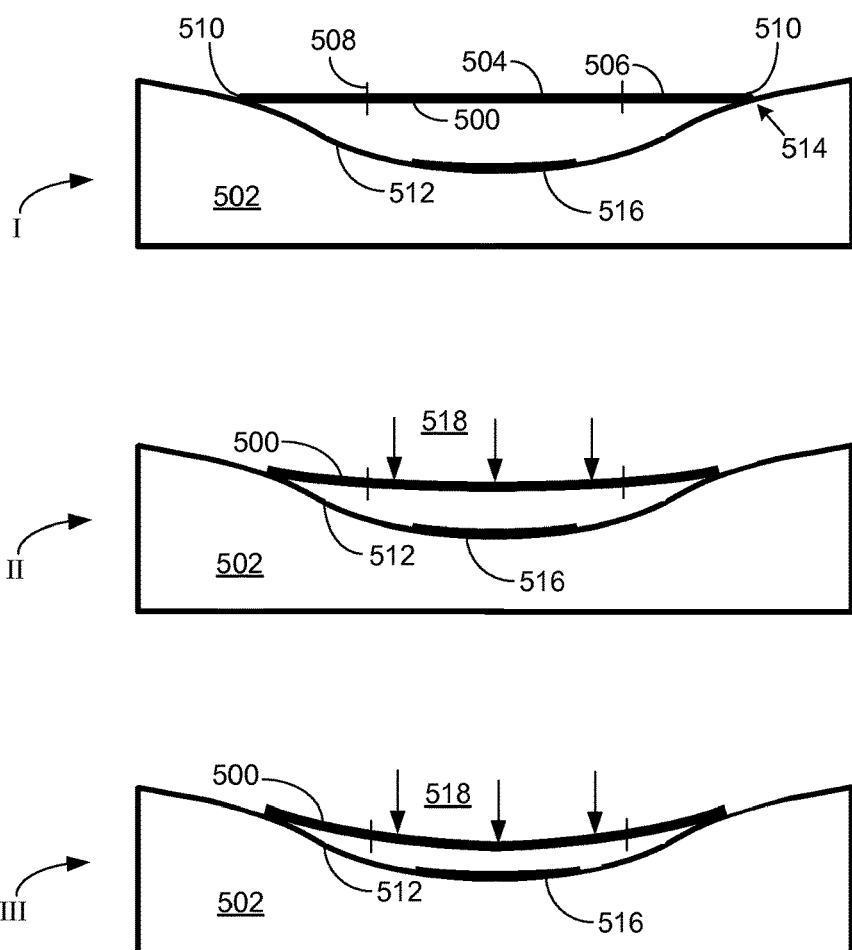
FIG. 5 includes progressive cross-section views of an example photonic sensor chip in a mold during a bending process.

FIG. 5 includes cross-section views of a photonic sensor chip 500 on a recessed surface of a mold 502 during a bending process, according to various examples. Stages I, II, and III of the bending process are illustrated. Photonic sensor chip 500, which may be the same as or similar to photonic sensor chip 304 illustrated in FIG. 3, may include an active region 504 and an inactive region 506 that surrounds active region 504. Tick marks 508 indicate boundaries between the active and inactive regions. For a bending process, photonic sensor chip 500 may be placed in mold 502 so that portions (e.g., corners 510) of photonic sensor chip 500 are in contact with a surface 512 of mold 502, such as at locations 514. Accordingly, the remainder of photonic sensor chip 500 is suspended above surface 512. In some implementations, a separate bending substrate (not illustrated) may be placed above photonic sensor chip 500. Such a bending substrate may be used to modify stiffness or other physical characteristics of photonic sensor chip 500. In other implementations, a handling substrate (not illustrated) may be placed above photonic sensor chip 500. Such a handling substrate may be used, for example, if photonic sensor chip 500 does not include an inactive region, which may otherwise be used to handle and manipulate positioning and placement of the photonic sensor chip 500.

In particular examples, mold 502 has a radially varying curvature such that surface 512 of mold 502 includes a concave central region, a convex transition region, and an outer peripheral region, as described above for the example illustrated in FIG. 3. Photonic sensor chip 500 is positioned relative to mold 502 such that active region 504 is over and substantially covers the concave central region of mold 502 and inactive region 506 is at least partially over (and at least partially covers) the convex transition region and/or the outer peripheral region. The concave central region may have a relatively high degree of curvature to satisfy a desired optical prescription for photonic sensor chip 500. In contrast, the convex transition region and the outer peripheral region may have relatively small degrees of curvature (the outer peripheral region may be linear). Inactive region 506 of photonic sensor chip 500 need not be bent to as high a degree of curvature as the active region. Accordingly, the convex transition region and the outer peripheral region have a relatively lower degree of curvature to reduce bending stresses imparted to photonic sensor chip 500 during the bending process.

In stage I, photonic sensor chip 500 is placed on the recessed surface of mold 502 and supported by corners 510 of the photonic sensor chip resting on surface 512. In detail, photonic sensor chip 500 may be placed on the recessed surface of the mold such that active region 504 at least partially covers the concave central region and inactive region 506 at least partially covers the convex peripheral region. In particular, the active region covers the concave central region by being suspended over the concave central region. In other words, before the photonic sensor chip is bent, the active region of the photonic sensor chip and the concave central region are not in contact with one another. The active region, however, is positioned relative to the recessed surface 512 of the mold so that if the photonic sensor chip is pushed into contact with the recessed surface, the active region will be in contact with the concave central region.

In some implementations, an adhesive 516 may be placed on at least a portion of surface 512. In stage II, a force 518 may be applied to the top (e.g., the side of photonic sensor chip 500 that includes the active region) of photonic sensor chip 500. In some implementations, force 518 may be applied substantially uniformly across the area of photonic sensor chip 500. For example, a force applied across the area may have some variation but has a substantial uniformity so that the force uniformity is adequate to deform photonic sensor chip 500 from being substantially flat to a desired curvature. Any of a number of techniques may be used to apply such a force. In one technique, described in further detail below, for example, the pressure above photonic sensor chip 500 may be set to be higher than the pressure below the photonic sensor chip. A resulting net pressure differential may deform and bend photonic sensor chip 500 toward surface 512. Deformation may be elastic, for example. Such a pressure differential may be substantially constant (e.g., steady state), but may change over time. In another technique, a jet of fluid (e.g., gas or liquid) may be applied to photonic sensor chip 500 from above the photonic sensor chip 500.

In some implementations, force 518 may be applied across the area of photonic sensor chip 500 by pressing on the chip with a forming tool (e.g., stamp) having non-uniform density or resilience. For example, pressure on photonic sensor chip 500 may be applied by a forming tool having a particular shape and comprising a material having particular compliance/rigidity such that the pressure is applied over the area of the photonic sensor chip in a favorably gradual and controlled manner. Applying such a forming tool may allow photonic sensor chip 500 to undergo displacement corresponding to a forming-shaping process. A forming tool having a higher radius of curvature than that of surface 512 may be pushed onto photonic sensor chip 500. The center portion of the forming tool may be softer (e.g., resilient) than at the edges of the forming tool. This may allow for a relatively slow buildup of pressure applied to photonic sensor chip 500 as the forming tool is pushed against (e.g., lowered onto) the sensor chip.

In stage III, photonic sensor chip 500 may continue to bend as force 518 continues to be applied to the top of photonic sensor chip 500. In this way, photonic sensor chip 500 may be bent to contact and conform to the shape of surface 512 of mold 502. Adhesive 516 may adhere (e.g., after a curing process) photonic sensor chip 500 to surface 512 so that force 518 may be discontinued without the photonic sensor chip resiliently assuming its original flat shape. As described below, the combination of photonic sensor chip 500 and mold 502 (adhered to one another) may comprise a curved photo sensor that can be incorporated into an optical device or system, for example.

Figure 6:
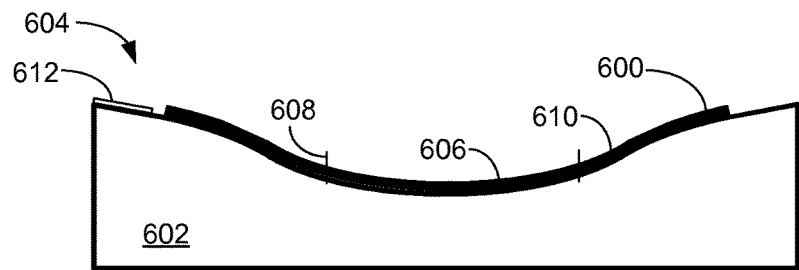
FIG. 6 is a cross-section view of an example photonic sensor chip mounted to a mold.

FIG. 6 is a cross-section view of a photonic sensor chip 600 mounted to a mold 602, according to various examples. The combination of photonic sensor chip 600 and mold 602, which are adhered to one another, may comprise a stand-alone curved photo sensor 604 that can be incorporated into an optical device or system, for example. As described above, for the examples illustrated in FIGS. 3 and 5, an active region 606, boundaries of which are indicated by tick marks 608, may have a relatively high degree of curvature as compared to an inactive region 610 of photonic sensor chip 600.

In some examples, a convex transition region and/or an outer peripheral region of mold 602 may include electronic circuitry 612. Such circuitry may be electronically interconnected to active region 606 of the photonic sensor chip 600 after the photonic sensor chip 600 and mold 602 are adhered to one another.

Figure 7:
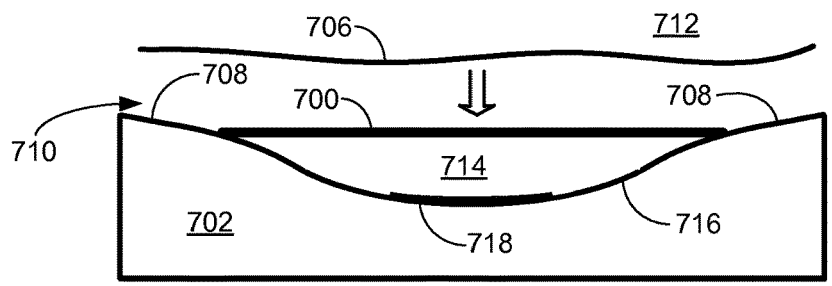
FIG. 7 is a cross-section view of an example photonic sensor chip in a mold and covered with a resilient film.

FIG. 7 is a cross-section view of a photonic sensor chip 700 in a mold 702 and covered with a resilient film 706, according to various examples. As mentioned above, a force (e.g., force 518 illustrated in FIG. 5) may be applied to the top (e.g., the side of photonic sensor chip 700 that includes the active region) of photonic sensor chip 700. One example technique for generating and applying such a force includes setting the pressure above photonic sensor chip 700 to be higher than the pressure below the photonic sensor chip. To create an environment that allows for such a pressure differential, a resilient film 706 may be placed on photonic sensor chip 700. Resilient film 706 may overlap and extend beyond edges of photonic sensor chip 700 and rest on upper portions 708 of mold 702. In this fashion, resilient film 706 may form a substantially impermeable seal 710 between a volume 712 above the resilient film and a volume 714 below the resilient film. For example, seal 710 may be substantially impermeable to fluids such as gases or liquids. Accordingly, a pressure differential may exist across the resilient film. Moreover, because resilient film 706 is placed on photonic sensor chip 700, such a pressure differential may exist across the photonic sensor chip. In some examples, the resilient film may further act to distribute force to the photonic sensor chip 700.

Volume 712 may be enclosed by resilient film 706 and a structure or cavity (not illustrated) above the resilient film (e.g., a bagging film). Volume 714 may be enclosed by resilient film 706 and surface 716 of mold 702. A pressure differential may be created by increasing the pressure of volume 712 so as to be greater than the pressure of volume 714. Optionally, a pressure differential may be created by decreasing the pressure of volume 714 (e.g., creating a partial vacuum) so as to be less than the pressure of volume 712. Such a pressure differential may create a substantially uniform force on photonic sensor chip 700 to bend the photonic sensor chip into the shape of surface 716. An adhesive 718 may be used to permanently join photonic sensor chip 700 to surface 716.

Figure 8:
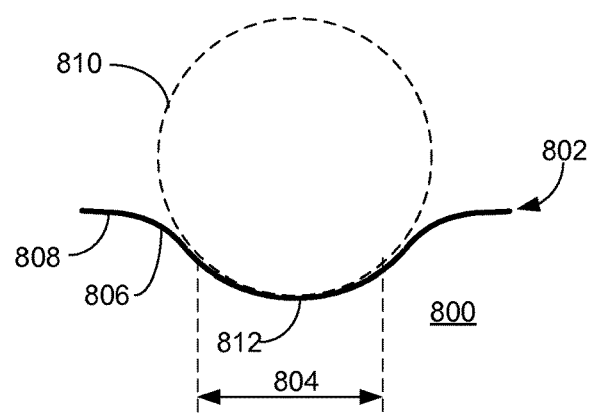
FIG. 8 is a schematic diagram of an example mold having radially varying curvature and a spherical central portion.

FIG. 8 is a schematic diagram of a mold 800 having a surface 802 with radially varying curvature, including a spherical central portion 804, a transition region 806, and an outer peripheral region 808, according to a number of examples. Mold 800 may be used in bending processes, such as those described above, to produce spherical shapes, for example. A virtual sphere 810 is included in the figure to demonstrate the spherical shape of spherical central portion 804. Following surface 802 from the center 812, spherical central portion 804 has a relatively high degree of curvature that corresponds to a spherical shape of a desired optical prescription for the active region of a curved photonic sensor chip. Reaching transition region 806, the degree of curvature of surface 802 begins to decrease and deviate from the spherical shape of the spherical central portion. Past the transition region, the degree of curvature of outer peripheral region 808 decreases further, and may be zero for this portion of surface 802.

Figure 9:
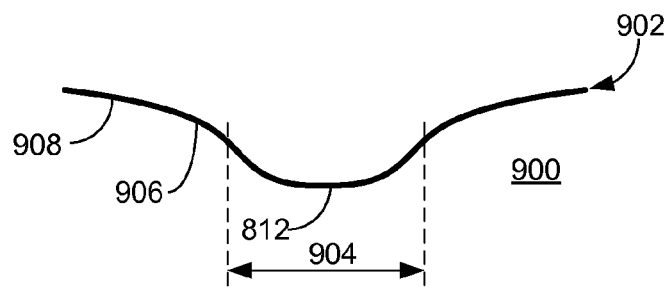
FIG. 9 is a schematic diagram of an example mold having radially varying curvature and an aspherical central portion.

FIG. 9 is a schematic diagram of a mold 900 having a surface 902 with radially varying curvature, including an aspheric central portion 904, a transition region 906, and an outer peripheral region 908. Mold 900 may be used in bending processes, such as those described above, to produce simple or complex shapes, for example. Following surface 902 from the center 910, parts of aspheric central portion 904 have a relatively high degree of curvature that corresponds to an aspheric shape of a desired optical prescription for the active region of a curved photonic sensor chip. Reaching transition region 906, the degree of curvature of surface 902 begins to decrease. Past the transition region, the degree of curvature of outer peripheral region 908 decreases further, and may be zero for this portion of surface 902. Of course, a surface of a mold may have any spherical or aspheric shape of combination thereof, and claimed subject matter is not so limited.

Figure 10:
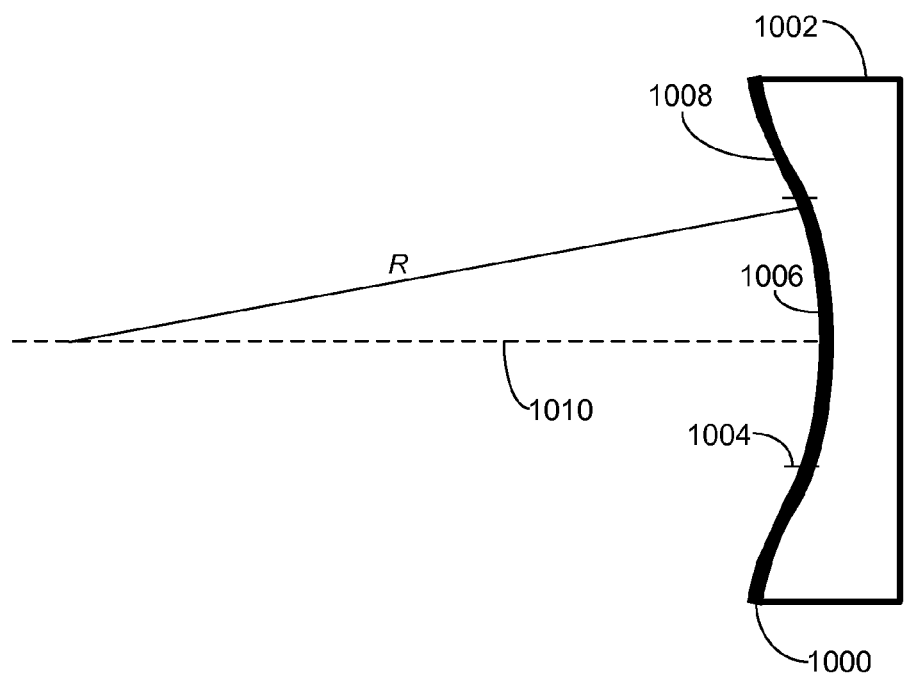
FIG. 10 is a cross-section view of an example curved photonic sensor chip and a substrate.

FIG. 10 is a cross-section view of a curved photonic sensor chip 1000 and a substrate 1002, according to various examples. For example, photonic sensor chip 1000 may be the same as or similar to photonic sensor chip 500 subsequent to a bending process described above. In some implementations, substrate 1002 may be the same as or similar to mold 502, illustrated in FIG. 5. The active region of photonic sensor chip 1000, indicated by tick marks 1004, is between the tick marks in a central region 1006 of a surface 1008 of substrate 1002.

The combination of a curved photonic sensor chip bonded to a substrate (e.g., formerly a mold used for shaping the curved photonic sensor chip) may comprise a stand-alone optical device that may be subsequently incorporated into optical systems. An optical axis 1010 of such optical systems is shown in relation to photonic sensor chip 1000. A focal length of the active region of photonic sensor chip 1000, which is based, at least in part, on the curved shape of the active region, may be a significant factor when photonic sensor chip 1000 is incorporated in an optical system. When the shape of photonic sensor chip 1000 is substantially spherical, the focal length of photonic sensor chip 1000 may be at least approximately equal to the inverse of the radius of curvature R of the active region of photonic sensor chip 1000. If the active region of photonic sensor chip 1000 has an aspheric shape, then the active region changes with distance from optical axis 1010. An optical system that incorporates photonic sensor chip 1000 may be designed to accommodate such a variable radius of curvature.

Figure 11:
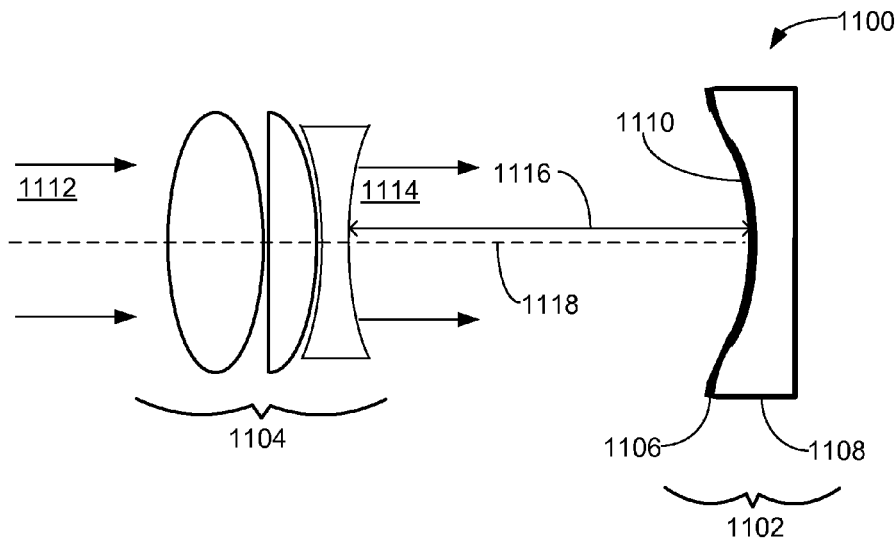
FIG. 11 is a cross-section view of an example optical system that includes a curved photonic sensor chip and a substrate.

FIG. 11 is a cross-section view of an optical system 1100 that includes a curved photonic sensor module 1102 and a lens assembly 1104, according to various examples. In particular, photonic sensor module 1102 comprises a curved photonic sensor chip 1106 and a substrate 1108, which may have formerly been the mold used to shape photonic sensor chip 1106. Curved photonic sensor chip 1106 includes an active region 1110. Curved photonic sensor chip 1106 and substrate 1108 may be similar to or the same as curved photonic sensor chip 500 and mold 502 illustrated in FIG. 5. In some implementations, substrate 1108 is sufficiently rigid to maintain the curved shape of curved photonic sensor chip 1106.

Curved photonic sensor chip 1106 (e.g., active region 1110) may have a shape that gives rise to a focal length. Such a focal length may be considered when placing photonic sensor module 1102 in optical system 1100. In particular, lens assembly 1104 may be designed to receive light 1112, optically operate on the light, and produce light output 1114 that focuses an image onto curved photonic sensor chip 1106, which may be a distance 1116 from lens assembly 1104. Distance 1116 may be at least approximately equal to a focal length of curved photonic sensor chip 1106. In some implementations, an inverse of the focal length of curved photonic sensor chip 1106 is at least approximately equal to the radius of curvature of curved photonic sensor chip 1106. Lens assembly 1104 and photonic sensor module 1102 may be aligned along an optical axis 1118.

Figure 12:
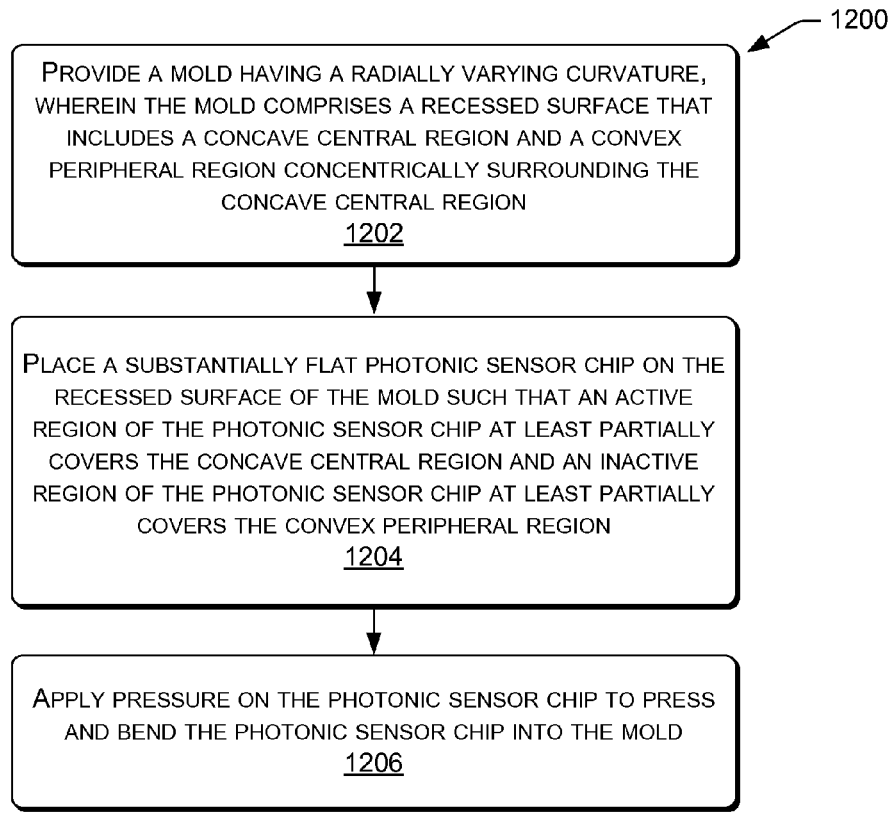
FIG. 12 is a flow diagram illustrating example processes for bending a photonic sensor chip.

FIG. 12 is a flow diagram illustrating a process 1200 for bending a photonic sensor chip, according to some examples. For example, such a photonic sensor chip may be the same as or similar to photonic sensor chip 500 illustrated in FIG. 5. Process 1200 may be similar to or the same as at least a portion of the process depicted in FIG. 5 and may be performed by a fabricator. At block 1202, a fabricator may provide a mold to use in process 1100. Such a mold may have a radially varying curvature. The mold may comprise a recessed surface that includes a concave central region and a convex peripheral region concentrically surrounding the concave central region.

At block 1104, the fabricator may place a substantially flat photonic sensor chip on the recessed surface of the mold such that an active region of the photonic sensor chip at least partially covers the concave central region and an inactive region of the photonic sensor chip at least partially covers the convex peripheral region. In particular, the active region covers the concave central region by being suspended over the concave central region. In other words, before the photonic sensor chip is bent, the active region of the photonic sensor chip and the concave central region are not in contact with one another. The active region, however, is positioned relative to the recessed surface of the mold so that if the photonic sensor chip is pushed into contact with the recessed surface, the active region will be in contact with the concave central region.

At block 1606, the fabricator may apply pressure on the photonic sensor chip to press and bend the photonic sensor chip into the mold and form a concave shaped active region of the photonic sensor chip. In some implementations, the pressure leads to a force on the photonic sensor chip that is applied substantially uniformly across the area of the photonic sensor chip.

Example Clauses

A. A method comprising: placing a substantially flat photonic sensor chip on a recessed surface of a mold such that an active region of the photonic sensor chip at least partially covers a concave central region of the mold and an inactive region of the photonic sensor chip at least partially covers a convex peripheral region of the mold, wherein the mold has a radially varying curvature and the recessed surface includes the concave central region and the convex peripheral region concentrically surrounding the concave central region; and applying pressure on the photonic sensor chip to press and bend the photonic sensor chip into the mold.

B. The method as paragraph A recites, wherein placing the substantially flat photonic sensor chip on the recessed surface of the mold further comprises: placing an edge or corners of the photonic sensor chip to be in contact with the recessed surface of the mold, wherein the active region of the photonic sensor chip is suspended above the concave central region of the recessed surface.

C. The method as paragraph B recites, wherein the edge or corners of the photonic sensor chip are placed in contact with the convex peripheral region of the recessed surface.

D. The method as paragraph A recites, wherein the recessed surface of the mold further includes a linear peripheral region concentrically surrounding the convex peripheral region, and wherein placing the substantially flat photonic sensor chip on the recessed surface of the mold further comprises: placing an edge or corners of the photonic sensor chip to be in contact with the linear peripheral region of the recessed surface, wherein the active region of the photonic sensor chip is suspended above the concave central region of the recessed surface of the mold.

E. The method as paragraph D recites, wherein transitions on the recessed surface between (i) the concave central region and the convex peripheral region and (ii) between the convex peripheral region and the linear peripheral region are smooth and continuous.

F. The method as paragraph A recites, wherein the pressure on the photonic sensor chip is substantially uniform across the area of the photonic sensor chip.

G. The method as paragraph A recites, further comprising: prior to applying the pressure, placing a resilient film on the photonic sensor chip, wherein the resilient film is substantially fluid-impermeable.

H. The method as paragraph G recites, wherein applying the pressure further comprises: setting gas pressure of a volume above the resilient film to be greater than a gas pressure of a volume below (i) the resilient film and (ii) the photonic sensor chip.

I. A method comprising: placing a substantially flat photonic sensor chip on a recessed surface of a concave mold such that (i) an active region of the photonic sensor chip is suspended over a first region of the recessed surface and (ii) portions of an inactive region of the photonic sensor chip are in contact with a second region of the recessed surface, wherein a degree of curvature of the first region is larger than a degree of curvature of the second region; and applying a substantially uniform force on the photonic sensor chip to bend the active region of the photonic sensor chip toward the first region of the recessed surface of the concave mold.

J. The method as paragraph I recites, wherein the portions of the inactive region of the photonic sensor chip that are in contact with the second region of the recessed surface comprise an edge or corners of the photonic sensor chip.

K. The method as paragraph I recites, wherein the recessed surface further includes a transition region between the first region and the second region, wherein a degree of curvature of the transition region is between the degree of curvature of the first region and the degree of curvature of the second region, and wherein the recessed surface is smooth and continuous between (i) the first region and the transition region and (ii) between the transition region and the second region.

L. The method as paragraph I recites, wherein the photonic sensor chip is rectangular and a cross-section of the recessed surface is circular or elliptical.

M. The method as paragraph I recites, further comprising: prior to placing the substantially flat photonic sensor chip on the recessed surface of the concave mold, placing an adhesive on at least a portion of the recessed surface to adhere the photonic sensor chip in a bent state to the recessed surface.

N. The method as paragraph M recites, further comprising: continuing to apply the substantially uniform force until the photonic sensor chip bends enough to contact the adhesive; applying electromagnetic radiation to the adhesive to cure the adhesive; and removing the substantially uniform force subsequent to the adhesive being cured.

O. The method as paragraph I recites, wherein the second region of the recessed surface includes electronic circuitry for transferring electronic signals from the active region of the photonic sensor chip, and further comprising: electronically interconnecting the active region of the photonic sensor chip with the electronic circuitry.

P. A device comprising: a curved substrate having a radially varying curvature, wherein the curved substrate includes a concave central portion and a convex peripheral portion concentrically surrounding the concave central portion; and a curved photonic sensor chip mounted to the curved substrate such that an active region of the photonic sensor chip substantially covers the concave central portion and an inactive region that surrounds the active region of the photonic sensor chip covers at least a portion of the convex peripheral portion.

Q. The device as paragraph P recites, wherein the curved substrate further includes a linear peripheral portion concentrically surrounding the convex peripheral portion, and wherein the inactive region at least partially covers the linear peripheral portion of the curved substrate.

R. The device as paragraph Q recites, wherein the linear peripheral portion includes electronic circuitry for transferring electronic signals from the active region of the photonic sensor chip.

S. The device as paragraph Q recites, wherein transitions between (i) the concave central region and the convex peripheral region and (ii) between the convex peripheral region and the linear peripheral region are smooth and continuous.

T. The device as paragraph P recites, wherein the concave central portion comprises a first material and the convex peripheral portion comprises a second material, and wherein the first material is different from the second material.

Conclusion

Although the subject matter has been described in language specific to structural features and/or methodological acts, it is to be understood that the subject matter defined in the appended claims is not necessarily limited to the specific features or acts described. Rather, the specific features and steps are disclosed as example forms of implementing the claims.

All of the methods and processes described above may be embodied in, and fully automated via, software code modules executed by one or more general purpose computers or processors. The code modules may be stored in any type of computer-readable medium, computer storage medium, or other computer storage device. Some or all of the methods may alternatively be embodied in specialized computer hardware such as, for example, a quantum computer or quantum annealer.

Conditional language such as, among others, "can," "could," "may" or "might," unless specifically stated otherwise, are understood within the context to present that certain examples include, while other examples do not include, certain features, elements and/or steps. Thus, such conditional language is not generally intended to imply that certain features, elements and/or steps are in any way required for one or more examples or that one or more examples necessarily include logic for deciding, with or without user input or prompting, whether certain features, elements and/or steps are included or are to be performed in any particular example.

Conjunctive language such as the phrase "at least one of X, Y or Z," unless specifically stated otherwise, is to be understood to present that an item, term, etc. may be either X, Y, or Z, or a combination thereof.

Any routine descriptions, elements or blocks in the flow diagrams described herein and/or depicted in the attached figures should be understood as potentially representing modules, segments, or portions of code that include one or more executable instructions for implementing specific logical functions or elements in the routine. Alternate implementations are included within the scope of the examples described herein in which elements or functions may be deleted, or executed out of order from that shown or discussed, including substantially synchronously or in reverse order, depending on the functionality involved as would be understood by those skilled in the art.

It should be emphasized that many variations and modifications may be made to the above-described examples, the elements of which are to be understood as being among other acceptable examples. All such modifications and variations are intended to be included herein within the scope of this disclosure and protected by the following claims.

What is claimed is:

1. A method comprising:
    placing a substantially flat photonic sensor chip over a recessed surface of a mold such that:
        an active region of the photonic sensor chip at least partially covers a concave surface of a central region of the mold;
        an inactive region of the photonic sensor chip at least partially covers a sloped portion of the mold, wherein the sloped portion has a convex surface profile, and wherein the sloped portion is located in a peripheral region of the mold; and
        at least one of edges and corners of the photonic sensor chip contact the sloped portion of the mold, wherein: curvature of the concave surface of the central region smoothly and continuously transitions to curvature of the convex surface profile of the peripheral region, and the convex surface profile of the peripheral region concentrically surrounds the concave surface of the central region; and
    applying pressure on the photonic sensor chip to press and bend the photonic sensor chip into the mold.

2. The method of claim 1, wherein the active region of the photonic sensor chip is suspended above the concave surface of the central region of the recessed surface.

3. The method of claim 1, wherein the at least one of edges and corners of the photonic sensor chip are in contact with the convex surface profile of the peripheral region of the recessed surface after applying pressure on the photonic sensor chip to press and bend the photonic sensor chip into the mold.

4. The method of claim 1, wherein the recessed surface of the mold further includes a linear peripheral region concentrically surrounding the convex surface profile of the peripheral region, and
    wherein the active region of the photonic sensor chip is suspended above the concave surface of the central region of the recessed surface of the mold.

5. The method of claim 4, wherein transitions of the recessed surface between the convex surface profile of the peripheral region and the linear peripheral region are smooth and continuous.

6. The method of claim 1, wherein the pressure on the photonic sensor chip is substantially uniform across the area of the photonic sensor chip.

7. The method of claim 1, further comprising:
    prior to applying the pressure, placing a resilient film on the photonic sensor chip, wherein the resilient film is substantially fluid-impermeable.

8. The method of claim 7, wherein applying the pressure further comprises:
    setting gas pressure of a volume above the resilient film to be greater than a gas pressure of a volume below (i) the resilient film and (ii) the photonic sensor chip.

9. The method of claim 1, wherein the concave surface of the central region of the mold comprises a first material and the sloped portion having the convex surface profile of the mold comprises a second material different from the first material.

10. A method comprising:
    placing a substantially flat photonic sensor chip over a concave surface portion of a mold such that (i) an active region of the photonic sensor chip is suspended over at least a part of the concave surface portion of the mold, (ii) at least portions of an inactive region of the photonic sensor chip cover an sloped portion of the mold, wherein the sloped portion is a convex surface portion of the mold, and (iii) at least one of edges and corners of the photonic sensor chip contact the sloped portion of the mold, wherein a degree of concavity of the concave surface portion decreases gradually toward the convex surface portion, wherein the concave surface portion of the mold further includes a transition region between the concave surface portion and the convex surface portion, and wherein a surface of the mold is smooth and continuous between (i) the concave surface portion and the convex surface portion and (ii) between the transition region and the convex surface portion; and applying a substantially uniform force on the photonic sensor chip to bend the active region of the photonic sensor chip toward the concave surface portion of the mold.

11. The method of claim 10, wherein the photonic sensor chip is rectangular and a cross-section of the concave surface portion of the mold is circular or elliptical.

12. The method of claim 10, further comprising:
prior to placing the substantially flat photonic sensor chip over the concave surface portion of the mold, placing an adhesive on at least a portion of the concave surface portion of the mold to adhere the photonic sensor chip in a bent state to the concave surface portion of the mold.

13. The method of claim 12, further comprising:
continuing to apply the substantially uniform force until the photonic sensor chip bends enough to contact the adhesive;
applying electromagnetic radiation to the adhesive to cure the adhesive; and
removing the substantially uniform force subsequent to the adhesive being cured.

14. The method of claim 10, wherein the concave surface portion of the mold includes electronic circuitry for transferring electronic signals from the active region of the photonic sensor chip, and further comprising:
electronically interconnecting the active region of the photonic sensor chip with the electronic circuitry.

15. The method of claim 10, wherein a transition from the concave surface portion and the convex surface portion is smooth and continuous.

16. The method of claim 10, further comprising:
prior to applying the substantially uniform force, placing a resilient film on the photonic sensor chip, wherein the resilient film is substantially fluid-impermeable.

17. The method of claim 10, wherein the at least one of edges and corners of the photonic sensor chip are in contact with the sloped portion of the mold after applying the substantially uniform force on the photonic sensor chip.

18. The method of claim 10, wherein the concave surface portion of the mold comprises a first material and the convex surface portion of the mold comprises a second material different from the first material.

19. A method comprising:
placing a substantially flat photonic sensor chip over a recessed surface of a mold, a first portion of which is concave and a second portion of which has a convex annular shape, such that (i) an active region of the photonic sensor chip is suspended over the first portion of the recessed surface, (ii) at least part of an inactive region of the photonic sensor chip cover the second portion of the recessed surface, and (iii) at least one of edges and corners of the photonic sensor chip contact a sloped portion of the mold, wherein a degree of curvature extending from within the first portion to within the second portion is smooth and continuous, wherein the first portion comprises a first material and the second portion comprises a second material different from the first material; and
applying a substantially uniform force on the photonic sensor chip to bend the active region of the photonic sensor chip toward the first region of the recessed surface of the concave mold.

20. The method of claim 19, wherein the at least one of edges and corners of the photonic sensor chip are in contact with the sloped portion of the mold after applying the substantially uniform force on the photonic sensor chip.

* * * * *